US009864037B2

(12) United States Patent
Rivet-Sabourin et al.

(10) Patent No.: US 9,864,037 B2
(45) Date of Patent: Jan. 9, 2018

(54) PHANTOM FOR CALIBRATION OF IMAGING SYSTEM

(71) Applicant: LABORATOIRES BODYCAD INC., Quebec (CA)

(72) Inventors: Geoffroy Rivet-Sabourin, Stoneham (CA); Florent Miquel, Quebec (CA)

(73) Assignee: LABORATOIRES BODYCAD INC., Québec (CA)

( * ) Notice: Subject to any disclaimer, the term of this patent is extended or adjusted under 35 U.S.C. 154(b) by 579 days.

(21) Appl. No.: 14/400,099

(22) PCT Filed: May 10, 2013

(86) PCT No.: PCT/CA2013/050361
§ 371 (c)(1),
(2) Date: Nov. 10, 2014

(87) PCT Pub. No.: WO2013/166606
PCT Pub. Date: Nov. 14, 2013

(65) Prior Publication Data
US 2015/0091562 A1 Apr. 2, 2015

Related U.S. Application Data

(60) Provisional application No. 61/645,701, filed on May 11, 2012.

(51) Int. Cl.
*G01R 33/56* (2006.01)
*G01R 33/58* (2006.01)
(Continued)

(52) U.S. Cl.
CPC ............. *G01R 33/58* (2013.01); *G01R 33/28* (2013.01); *G01R 33/565* (2013.01); *G01R 35/005* (2013.01)

(58) Field of Classification Search
CPC ...... G01R 33/58; G01R 33/28; G01R 33/565; G01R 35/005
See application file for complete search history.

(56) References Cited

U.S. PATENT DOCUMENTS 4,888,555 A 12/1989 Vaughan et al.
5,005,578 A 4/1991 Greer et al.
(Continued)

OTHER PUBLICATIONS

Barberi et al., "A Transmit-Only/Receive-Only (TORO) RF System for High-Field MRI/MRS Applications", Magnetic Resonance in Medicine 43:284-289, 2000.

*Primary Examiner* — Clayton E Laballe
*Assistant Examiner* — Ruifeng Pu
(74) *Attorney, Agent, or Firm* — Marshall, Gerstein & Borun LLP

(57) ABSTRACT

A phantom for a medical imaging system with a matrix of spherical hollow elements is provided, with adjacent ones of the elements of a same row being interconnected by and in fluid communication through a hollow tube extending therebetween, with each element being filled with a contrasting solution. Also, a phantom is provided having a plurality of groups of interconnected hollow elements received within a sealed enclosure with the elements of a same one of the groups being in fluid communication with one another and the elements of different ones of the groups being sealed from one another, and the elements of at least one of the groups being filled with a fluid more contrasting than the fluid filling the elements of at least another one of the groups. A method of correcting patient images is also provided.

13 Claims, 12 Drawing Sheets

(51) Int. Cl.
*G01R 33/565* (2006.01)
*G01R 33/28* (2006.01)
*G01R 35/00* (2006.01)

(56) References Cited

U.S. PATENT DOCUMENTS

| | | | |
|---|---|---|---|
| 5,545,995 A * | 8/1996 | Schneider | G01R 33/56563 324/300 |
| 6,697,661 B2 | 2/2004 | Raghavan et al. | |
| 6,965,235 B1 | 11/2005 | Guclu et al. | |
| 2005/0186241 A1 * | 8/2005 | Boyle | A61B 5/076 424/423 |
| 2007/0088211 A1 | 4/2007 | Cheng et al. | |
| 2008/0265882 A1 * | 10/2008 | Wiggins | A61B 5/055 324/308 |
| 2009/0326364 A1 | 12/2009 | Goldenberg et al. | |
| 2010/0021029 A1 | 1/2010 | Pearlstein et al. | |
| 2010/0198063 A1 | 8/2010 | Huber et al. | |
| 2012/0201438 A1 * | 8/2012 | Vermandel | G01N 29/0654 382/128 |

* cited by examiner

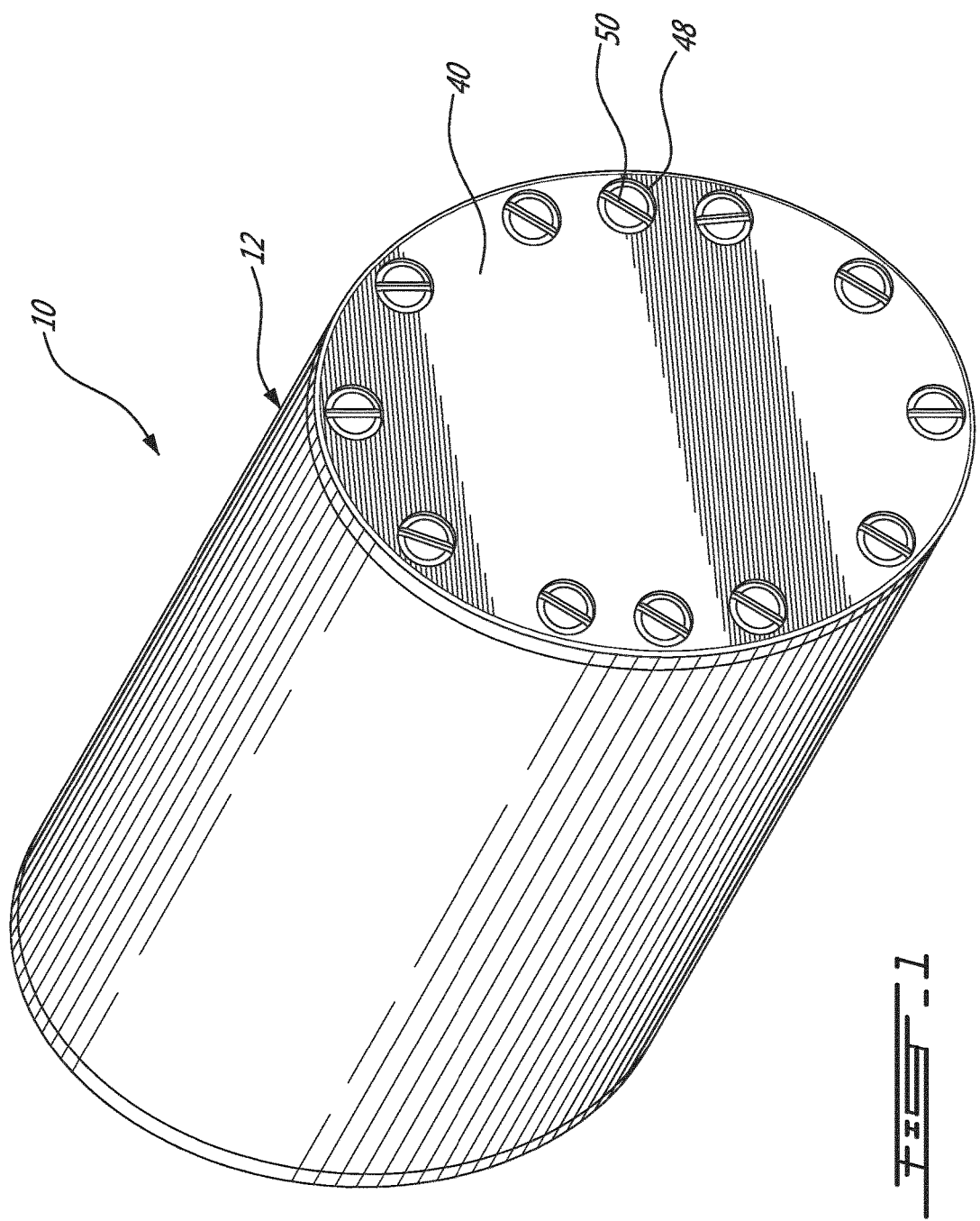

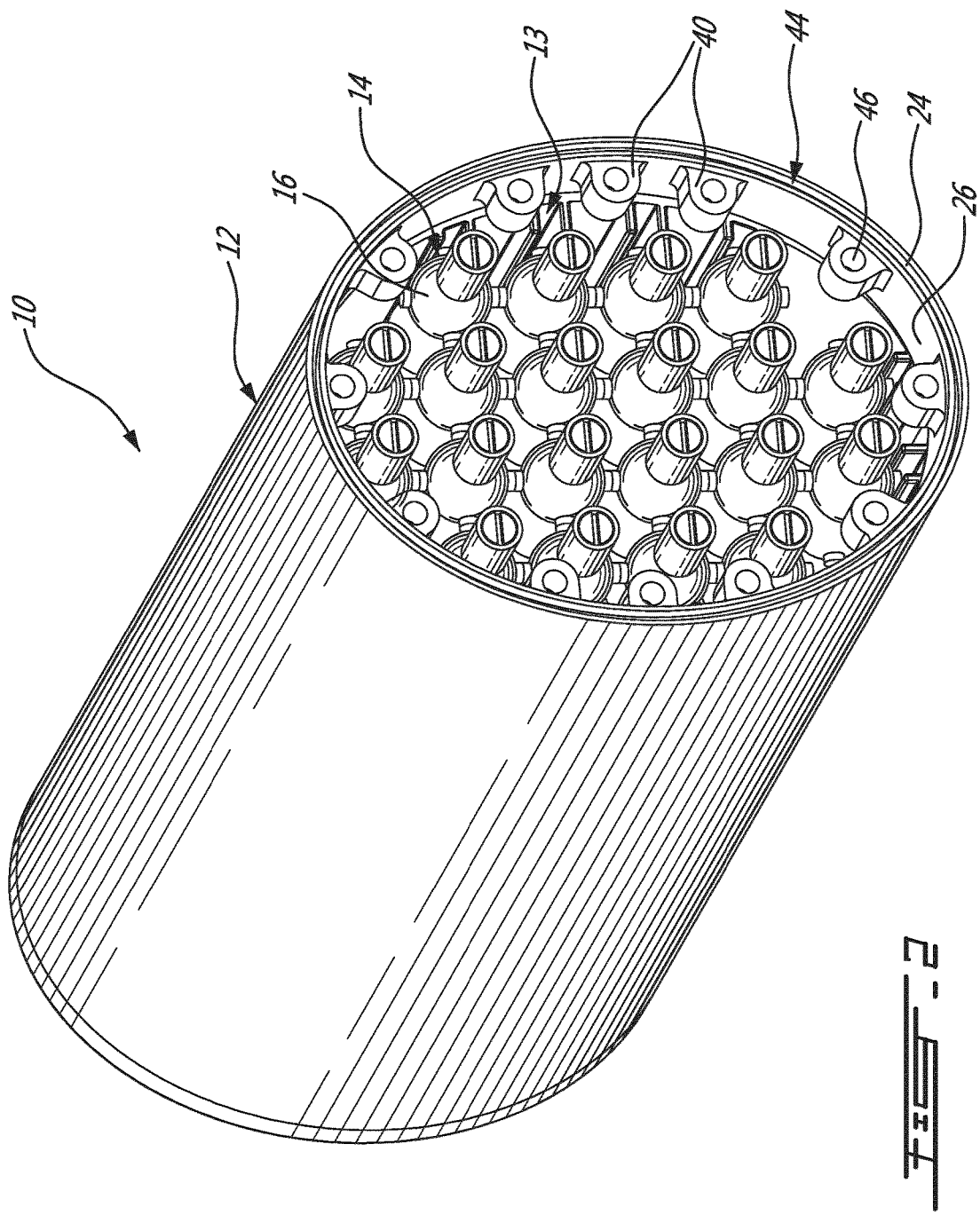

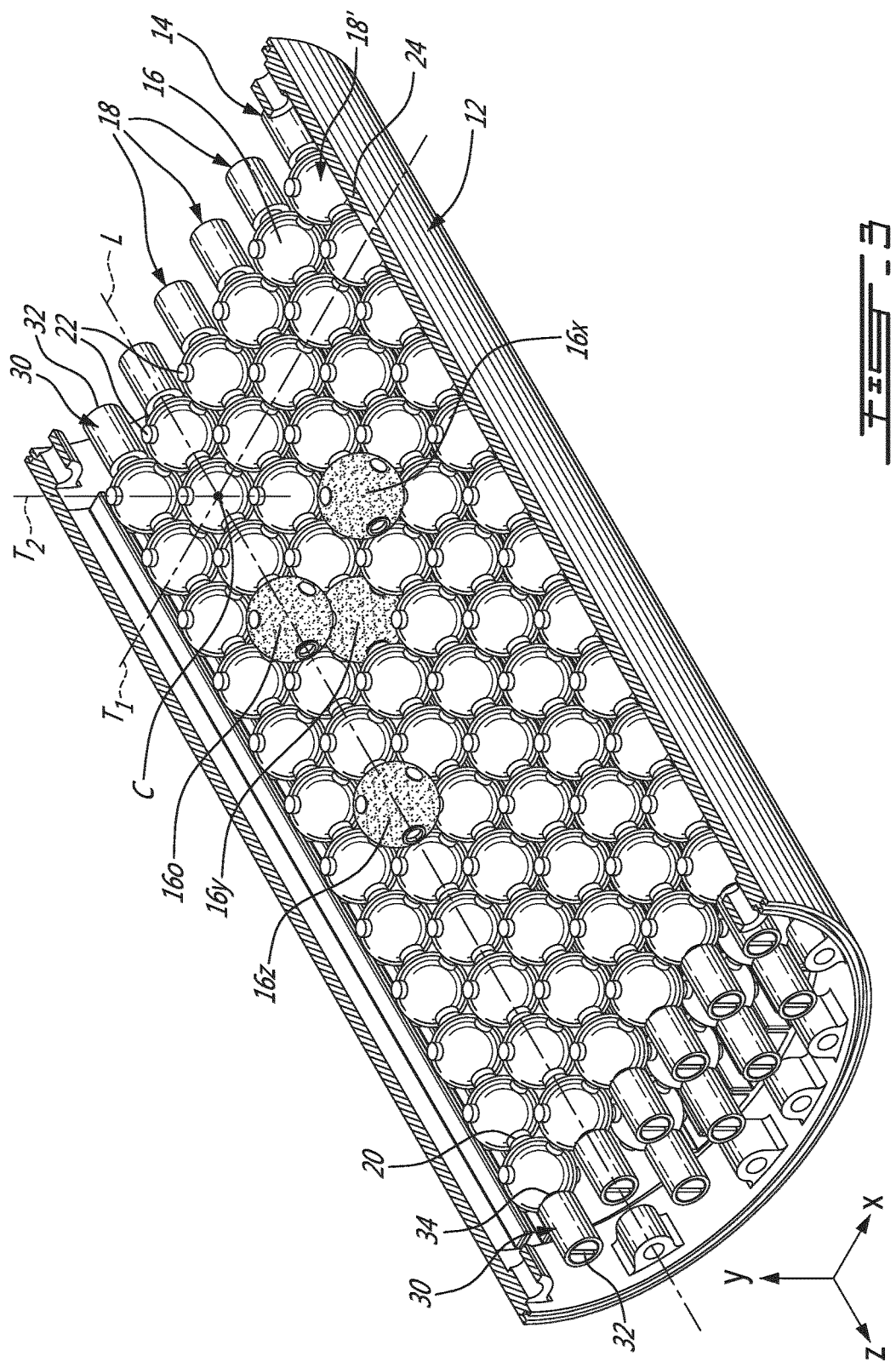

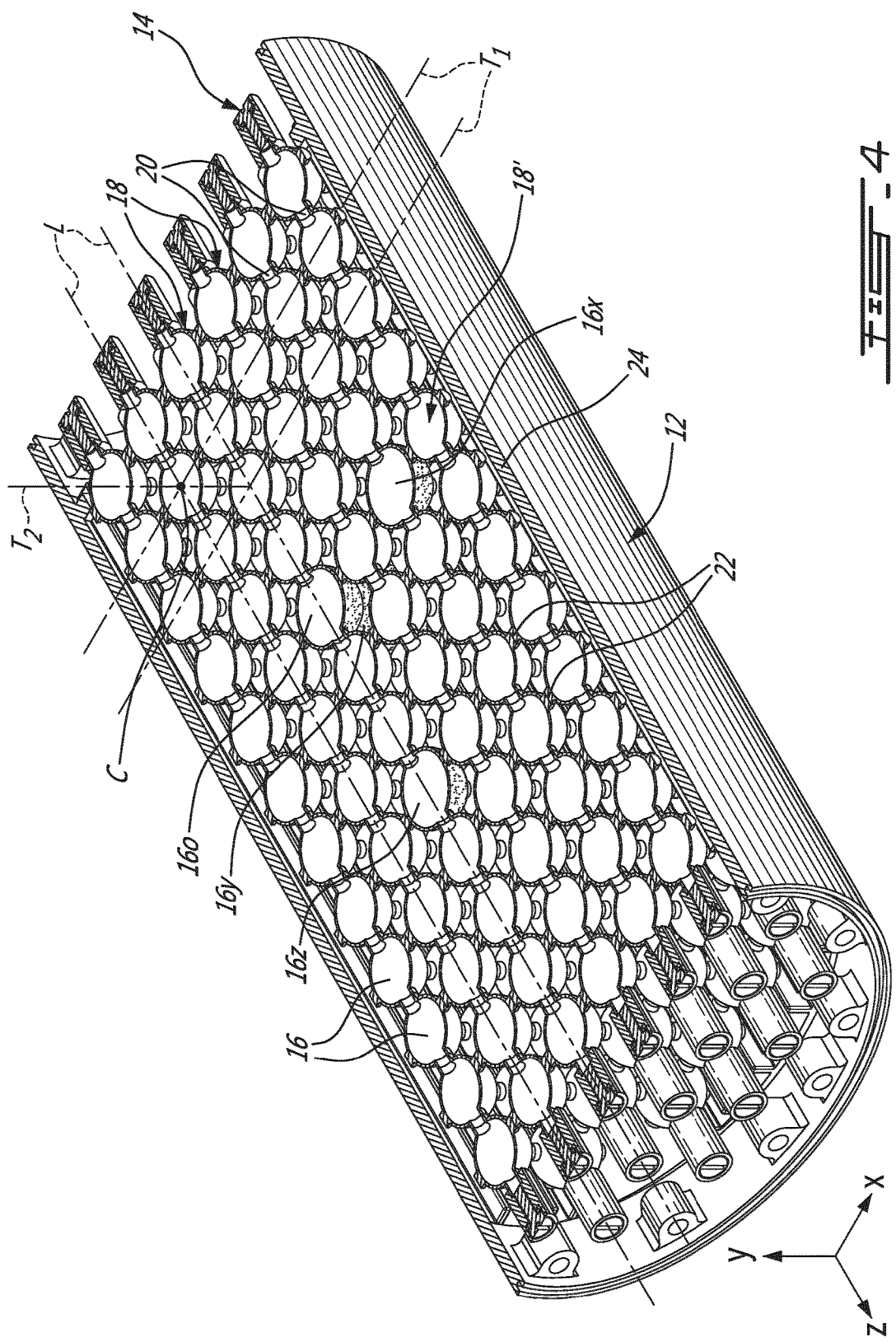

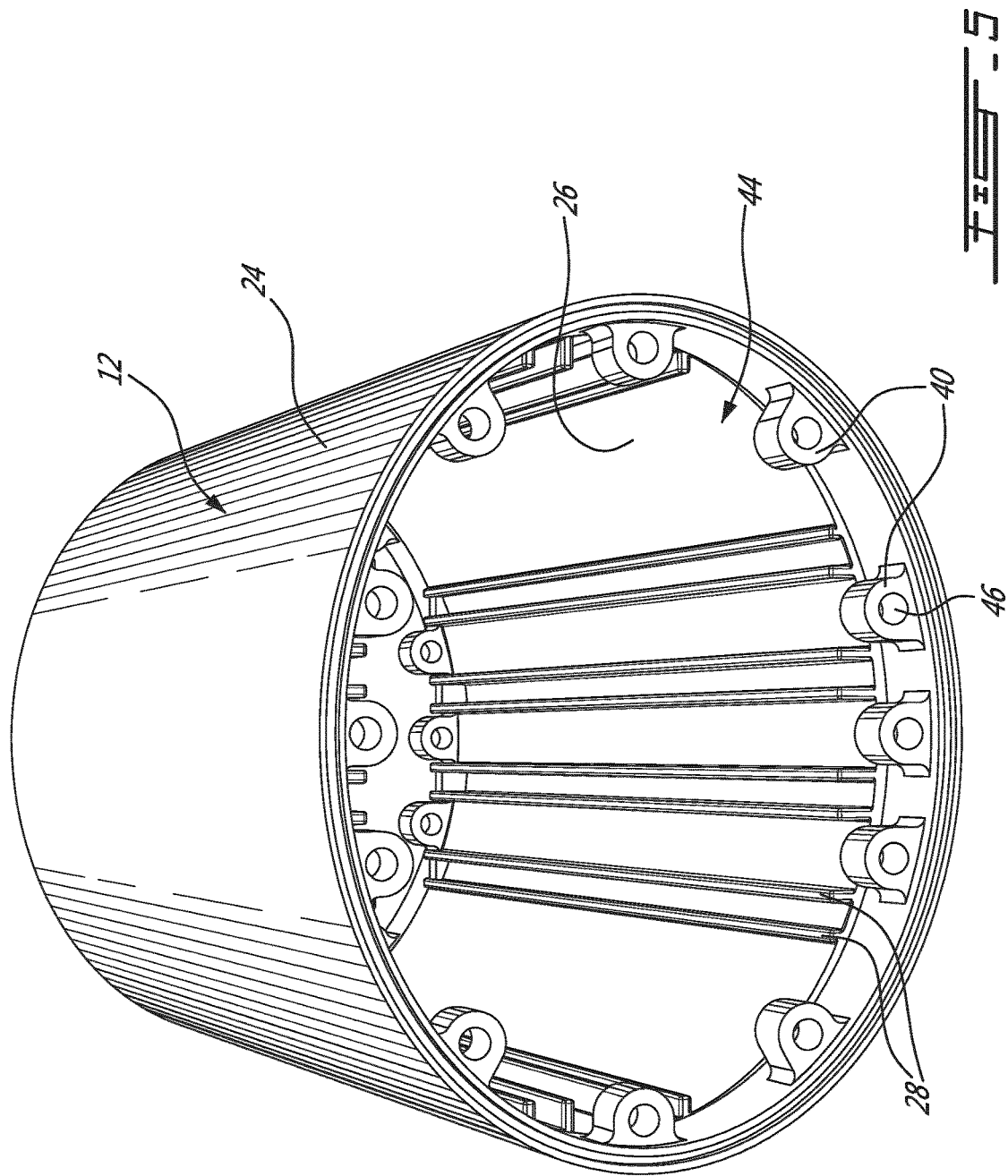

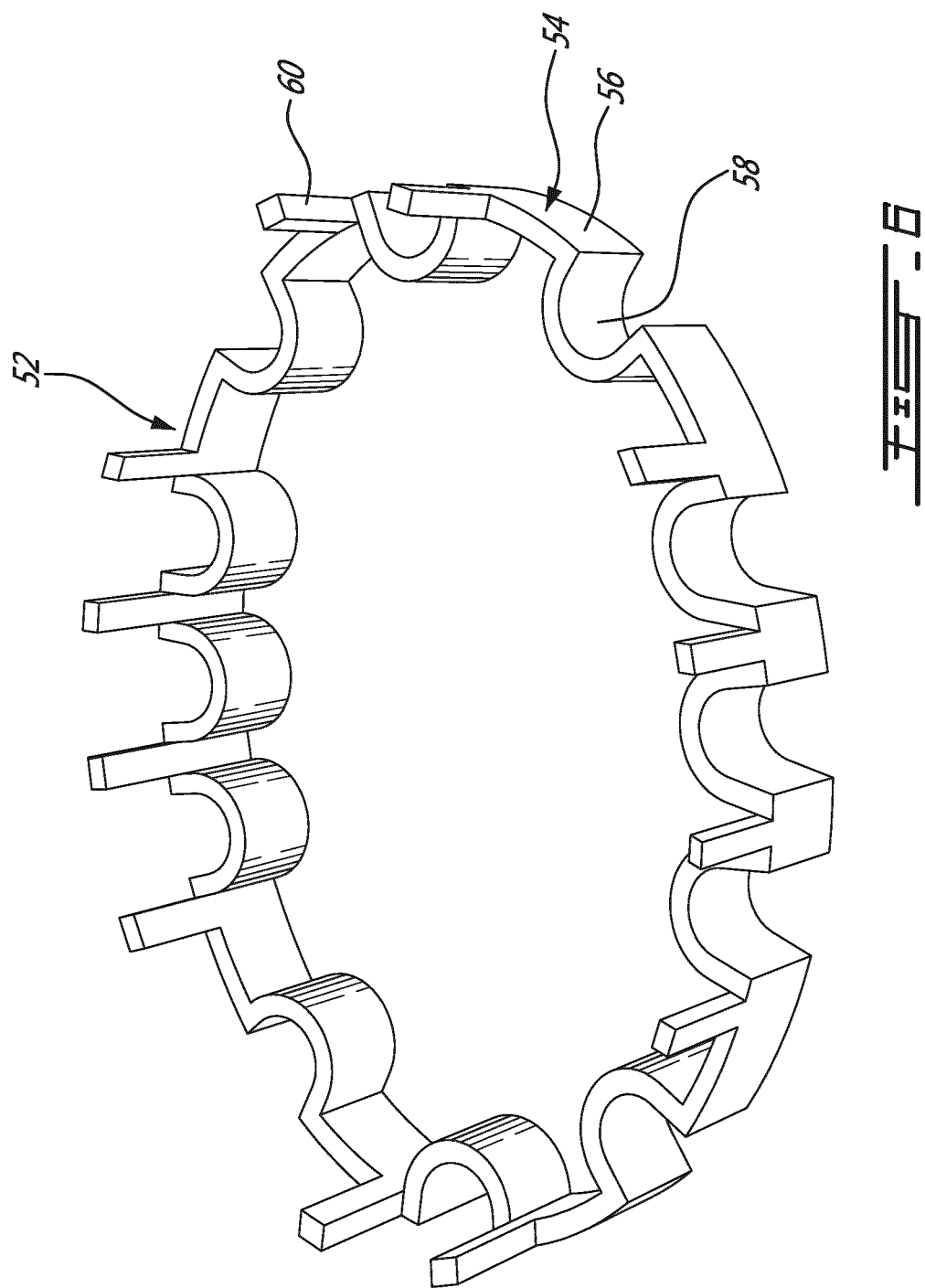

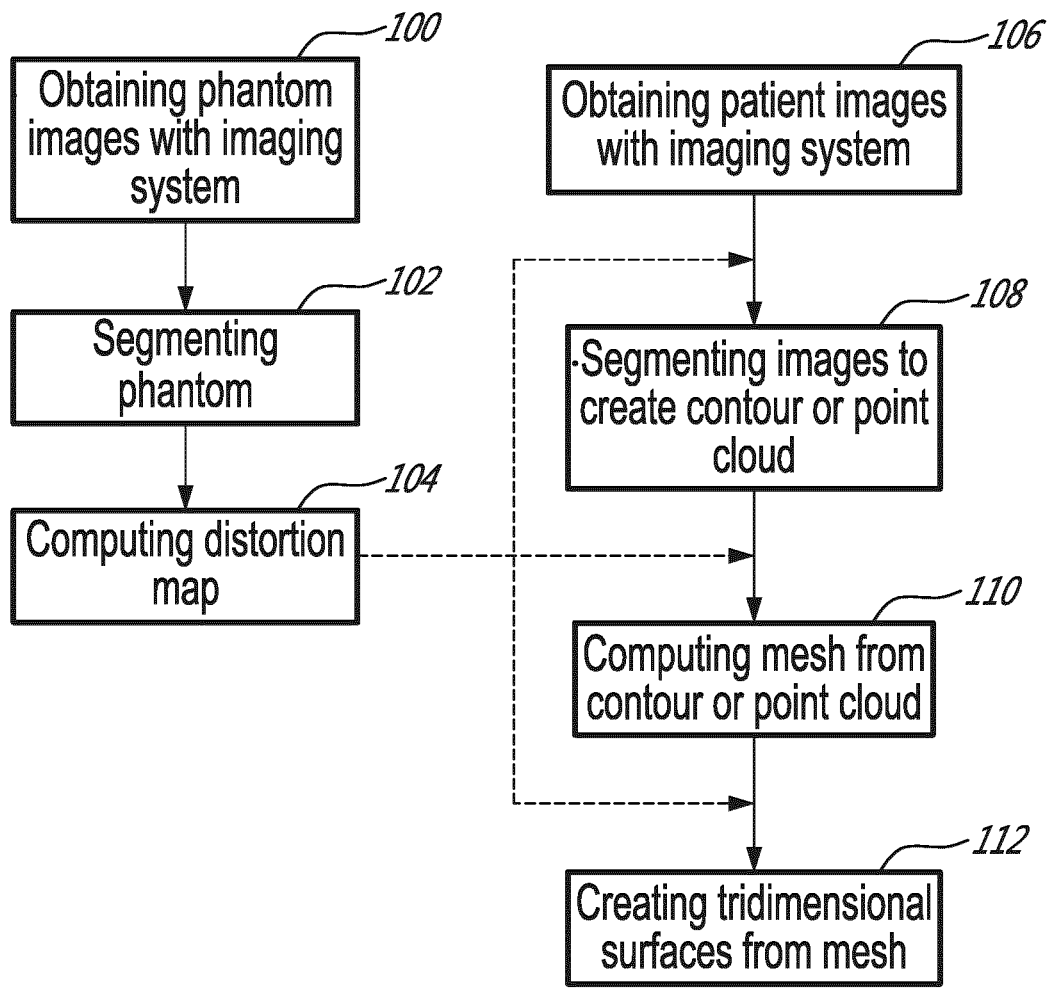

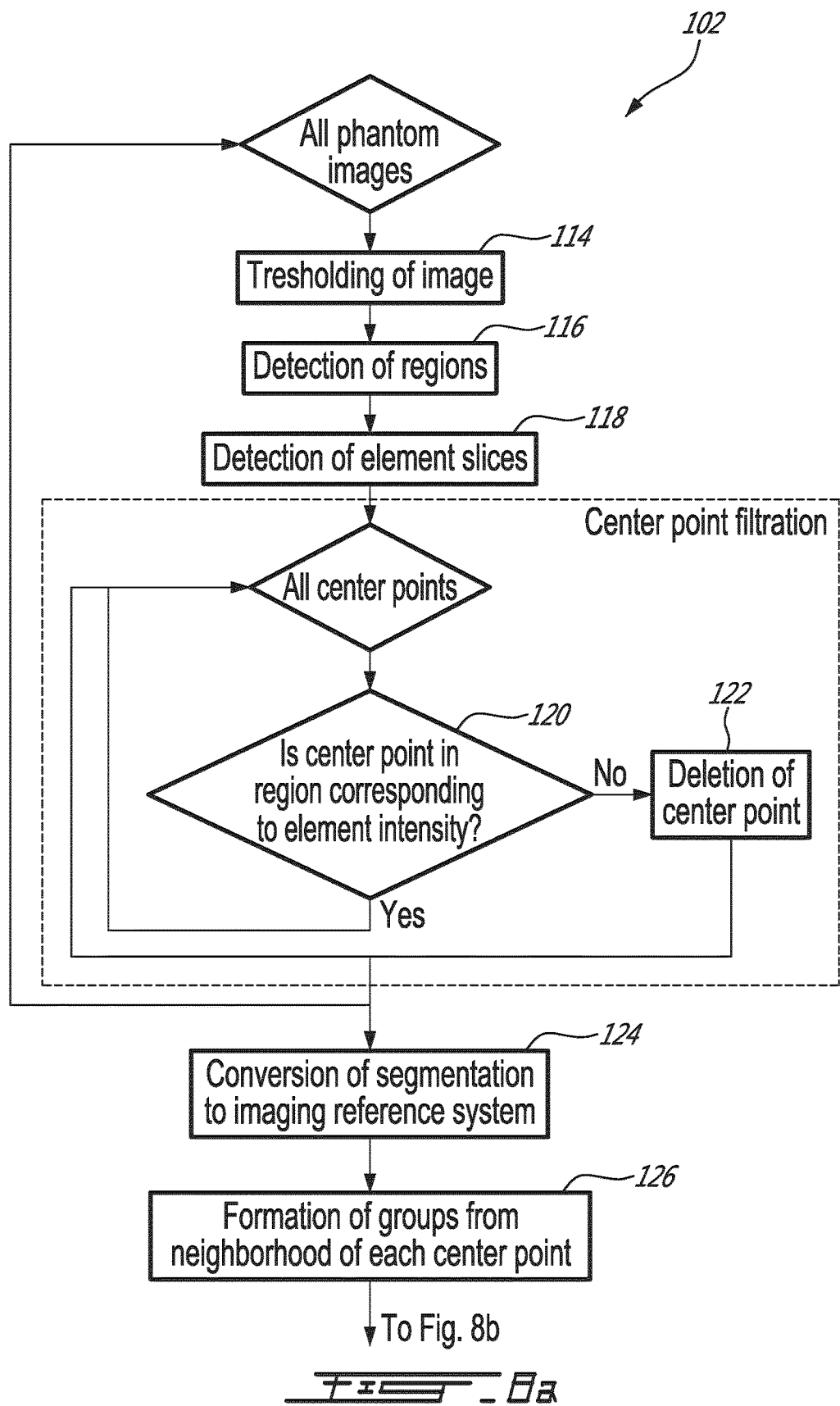

PHANTOM FOR CALIBRATION OF IMAGING SYSTEM

FIELD OF THE INVENTION

The present invention relates to imaging systems, more particularly to a phantom usable for the calibration thereof.

BACKGROUND ART

Imaging systems such as Magnetic Resonance Imaging (MRI) systems allow for the gathering of information on internal structures of the body for a variety of medical applications. However the images obtained from such systems are subject to distortions which in some cases may jeopardize the safety and/or the accuracy of the medical procedure for which the information is gathered.

Phantoms with interconnected hollow tubes providing control points to calibrate MRI imaging systems help improve the accuracy of the patient images obtained, but the accuracy may remain insufficient for some applications, for example the custom manufacturing of some implants and prosthesis.

SUMMARY

In one aspect, there is provided a phantom for a medical imaging system using a coil, the phantom comprising: a casing having at least one open end sealingly closed by a first removable cover and defining a sealed enclosure filled with a fluid, the casing being adapted to fit within an opening of the coil; and a matrix of spherical hollow elements having a fixed position relative to one another and received within the enclosure, the matrix being defined by a plurality of interconnected rows of the elements, adjacent ones of the elements of a same one of the rows being interconnected by and in fluid communication through a hollow tube extending therebetween, each row defining at least one open end in fluid communication with the elements thereof, the at least one open end being sealingly closed by a second removable closing member, each element being filled with a solution having a different contrast than that of the fluid.

In another aspect, there is provided a method of correcting tridimensional patient data from a medical imaging system, the method comprising: scanning a body portion of a patient received within an opening of a coil to create patient images, the coil having a given position in the imaging system; inserting a phantom within the opening of the coil at the given position before or after scanning the body portion and with the opening being free of the body portion; scanning the phantom to create phantom images of a plurality of elements of the phantom, each element having a center point with a respective known position with respect to a reference coordinate system of the phantom; determining a position of the center point of each element in the phantom images with respect to the reference coordinate system; computing a difference between the position of the center point of each element in the phantom images and the corresponding known position to create a distortion map; and applying a correction to tridimensional patient data based on the distortion map, the tridimensional patient data corresponding to the patient images or to subsequent data created from the patient images.

In a further aspect, there is provided a phantom for a medical imaging system, the phantom comprising: a casing having at least one open end sealingly closed by a first removable closing member and defining a fluid-filled sealed enclosure, the casing having an outer shape adapted to be received in an opening of a coil of the imaging system; and a plurality of groups of interconnected hollow elements received within the sealed enclosure, the elements of a same one of the groups being in fluid communication with one another, the elements of different ones of the groups being sealed from one another, each group including at least one open end in fluid communication with the elements of the group and sealingly closed by a second removable closing member, the groups being interconnected and retained within the sealed enclosure in a fixed position relative to one another, each element having a geometrical shape from which a center of the element can be determined, each element being filled with a fluid, the fluid filling the elements of at least one of the groups being more contrasting than the fluid filling the elements of at least another one of the groups.

BRIEF DESCRIPTION OF THE DRAWINGS

Reference will now be made to the accompanying drawings, showing by way of illustration one of more particular embodiment(s) of the present invention and in which:

FIG. 1 is a tridimensional view of a phantom according to a particular embodiment;

FIG. 2 is a tridimensional view of the phantom of FIG. 1 with a cover member thereof removed;

FIG. 3 is a tridimensional cross-sectional view of the phantom of FIG. 1 with only part of the casing thereof being shown;

FIG. 4 is a tridimensional cross-sectional view of part of the phantom of FIG. 1, showing hollow elements thereof in cross-section;

FIG. 5 is a tridimensional view of one end of the casing of the phantom of FIG. 1;

FIG. 6 is a tridimensional view of a spacer received within the phantom of FIG. 1;

FIG. 7 is a diagram of a process of application of a distortion map in accordance with a particular embodiment, using a phantom such as shown in FIG. 1;

FIGS. 8a-8b together show a diagram of a segmentation of the phantom in the process of FIG. 7, in accordance with a particular embodiment;

DETAILED DESCRIPTION OF PARTICULAR EMBODIMENTS

Figure 8B:
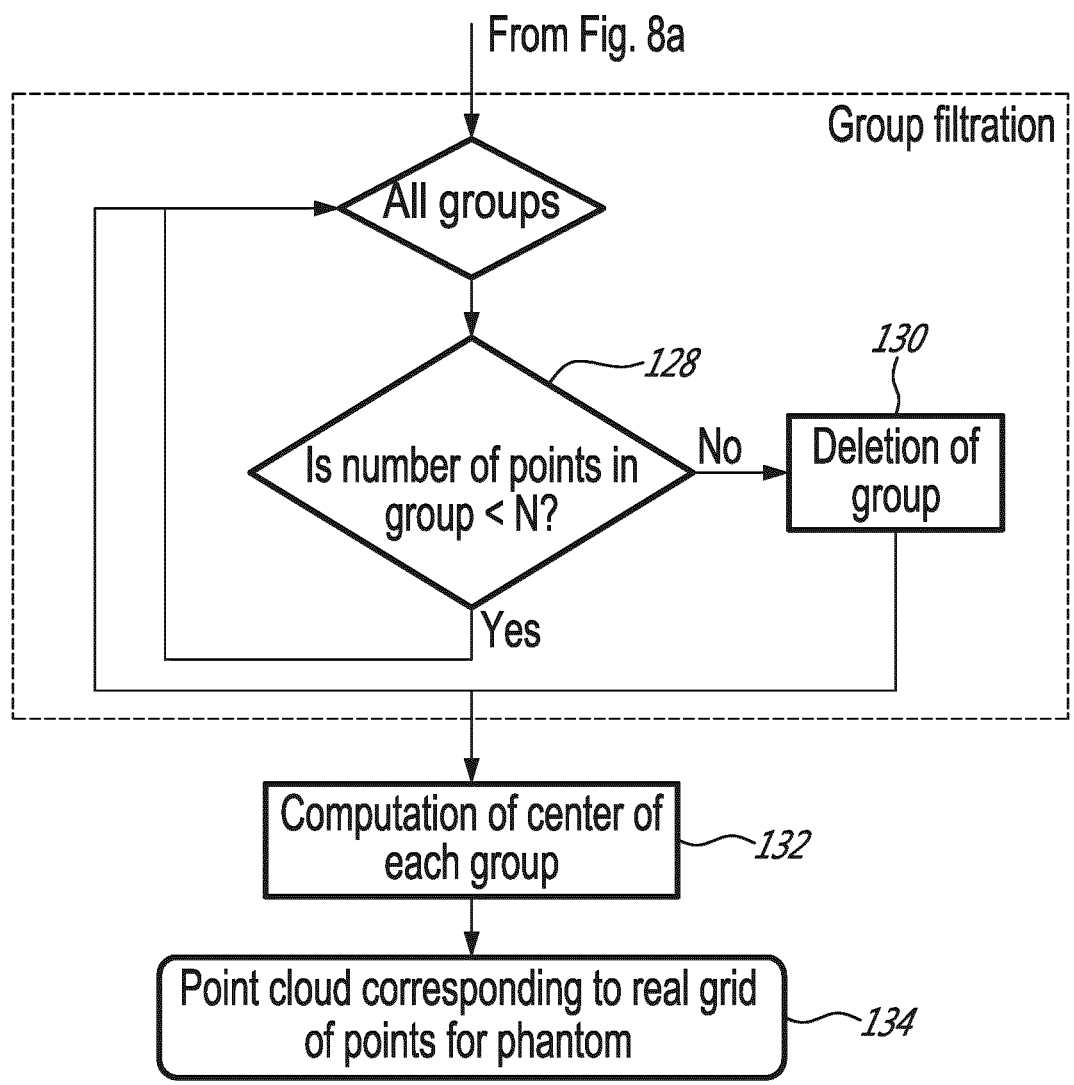

Referring to FIGS. 1-2, a phantom 10 generally includes a casing 12 defining a sealed enclosure 13, and a matrix 14 of hollow elements 16 (FIG. 2) received within the enclosure 13. The casing 12 is shaped and sized to snugly fit within the opening of a particular coil used for example in a MRI scan. In the embodiment shown, the casing 12 has a substantially tubular shape, with an elliptical cross-section, and is shaped and sized to be received within a knee coil. In a particular embodiment, the casing 12 is shaped to snuggly fit within the opening of the coil. Other shapes are also possible depending on the coil used during calibration; for example the casing 12 may have a spherical or substantially spherical shape complementary to the opening of a particular head coil.

Referring to FIGS. 2-3, the hollow elements 16 are rigidly interconnected such as to have a fixed position relative to each other. In the embodiment shown, the elements 16 are retained within the enclosure 13 such as to have a fixed position relative to the casing 12; alternately, the matrix of elements 16 may be movable within the enclosure 13. In the embodiment shown, the elements 16 have a spherical shape; such a shape facilitates the determination of the center of each element. Alternately, any other type of element having a shape (e.g. inner or outer wall surfaces) from which a center thereof can be readily determined may be used.

The elements 16 are fluidly interconnected in groups, with elements 16 of different groups being sealed from one another. In the embodiment shown and as can be more clearly seen in FIG. 4, each group corresponds to a longitudinal row 18, 18' of the elements 16. As such, each row 18, 18' includes regularly spaced apart elements 16 having a center located along a common axis L, with adjacent ones of the elements 16 of the row 18, 18' being interconnected through a hollow tube extending therebetween and having a central axis corresponding to the common axis L.

Referring to FIGS. 3-4, the elements 16 of adjacent rows 18, 18' are interconnected through pins 22 extending therefrom, which do not allow fluid communication therethrough. In the embodiment shown, the pins 22 extend along first and second transverse axes $T_1$, $T_2$ of each spherical element 16. The transverse axes $T_1$, $T_2$ extend through the center C of the spherical element 16 and are perpendicular to each other and to the common axis L of the row 18, 18'. As such, the spherical elements 16 within the matrix 14 are aligned to defined a perpendicular, tridimensional grid pattern. Other relative positions are also possible.

In the embodiment shown, the elements 16 of the rows adjacent the walls 24 of the casing 12, or outer rows 18', are also connected to or otherwise engage the walls 24 to prevent relative movement. As shown in FIG. 5, in a particular embodiment the inner surface 26 of the casing walls 24 includes longitudinally extending rails 28 protruding therefrom, between which the pins 22 extending from the adjacent elements 16 are slidingly and snugly received.

Each row 18, 18' of elements 16 is completely filled with a fluid containing a contrasting agent detectable by the scanning machine. In a particular embodiment, the fluid is a solution of copper pentasulfate in water; alternate contrasting agents which may be used include, but are not limited to, nickel chloride and sodium chloride. In a particular embodiment, at least two of the rows 18, 18' have different concentrations of the contrasting agent from one another. In another embodiment, all the rows 18, 18' have the same concentration of the contrasting agent. Once filled, the elements 16 can be scanned (CT scan, MRI, etc.) to ensure that no air remains therein.

Each row 18, 18' thus includes at least one open end 30 for insertion of the fluid therein. Referring back to FIG. 3, in the embodiment shown, each row 18, 18' includes two opposed open ends 30 to facilitate filling, each end 30 being sealed by a removable cover member 32, shown here in the form of a threaded cap or screw. Each open end 30 is defined by a hollow end tube 34 extending from the element 16 at the end of the row 18, 18' and in fluid communication therewith. The hollow end tube 34 is in alignment and opposed to the hollow tube 20 extending to the adjacent element of the row 18, 18'. Although a particular embodiment for the cap 32 is shown, any other adequate type of cover member may also be used to seal the open end(s) 30 of each row 18, 18'. For example, the cover member 32 may be configured with a curved slot receiving a pin of the hollow end tube 34 to form a bayonet lock (not shown). An o-ring (not shown) may be provided between the cover member 32 and the hollow end tube 34 to help seal their engagement.

Referring back to FIG. 1, the casing 12 also has at least one open end sealingly closed by a removable cover member 40 to allow the enclosure 13 to be fluid-tight. Although not shown, the opposed end of the casing 12 may also be openable and sealingly closed by a removable cover member. In the embodiment shown and as depicted in FIGS. 2 and 5, bosses 40 extend from the inner surface 26 of the casing wall 24 adjacent the open end 44, with each boss 40 having a longitudinally extending threaded hole 46 defined therethrough. Referring back to FIG. 1, the cover member 40 has a rim (not shown) engaging the edge of the wall 24 around the open end 44, and has holes 48 defined therethrough in alignment with each of the threaded holes 46 of the bosses 42. The cover 40 is retained in place by threaded fasteners 50 received in the aligned holes 46, 48. A seal such as an o-ring may be provided where the cover 40 engages the edge of the wall 24 around the open end 44. Although a particular embodiment for the cover member 40 is shown, any other adequate type of cover member may also be used to seal the open end(s) 44 of the casing 12.

Referring to FIG. 6, in the embodiment shown, the phantom 10 further includes a spacer 52 which is received within the enclosure 13 to abut the closed cover member 40 and the portion of the matrix 14 adjacent thereto, to prevent movement in the longitudinal direction. The spacer 52 includes a perimeter wall 54 having oval portions 56 with a shape complementary to that of the inner surface 26 of the casing wall 24, such as to be in abutment therewith. Inwardly protruding portions 58 are defined between the oval portions 56, located, sized and shaped to be complementary to the bosses 42 extending from the inner surface 26 of the casing wall 24 to surround and abut them. Arms 60 extend from the perimeter wall 54, here from the oval portions 56 thereof, and are sized to contact the matrix 14, i.e. the elements 16 or hollow tubes 20 extending therebetween, while the opposed edge of the perimeter wall 54 abuts the closed cover member 40. Thus, in the embodiment shown, the spacer 52 prevents longitudinal movement of the matrix 14 of elements 16 within the enclosure 13, while the abutment between the pins 22 extending from the elements 16 of the outer rows 18' and the inner surface 26 of the casing wall 24 prevents radial movement of the matrix 14, and the engagement of the pins 22 extending from some of the elements 16 of the outer rows 18' between the rails 28 prevents circumferential movement of the matrix 14. Other types of engagement/connections between the matrix 14 of elements 16 and the casing 12 may be provided, as long as movement of the matrix 14 within the sealed enclosure 13 is prevented.

The enclosure 13 is filled with a fluid, which in a particular embodiment has a different contrast than that of the fluid contained in the elements 16. In a particular embodiment, the enclosure 13 is filled with a fluid less contrasting than the fluid contained in the elements 16. In another particular embodiment, the enclosure 13 is filled with a fluid having a similar contrast than the fluid contained in the elements 16. In a particular embodiment, the enclosure 13 is filled with distilled water. An alternate fluid which may be used includes, but is not limited to, silicon oil.

The individual elements 16 are sized such that at least three elements fit within the field of view of the scanning machine. The individual elements 16 have each have a center point having a known position, and the center points are thus located at known distances from one another. In the embodiment shown the elements 16 are regularly spaced apart and have known similar dimensions, but alternately spacing between the elements 16 and/or size of the elements 16 may vary. The interconnected elements 16 are manufactured using a process having small tolerances and/or measured using a process having small tolerances, such that the dimensions of each element 16 and its relative position within the matrix 14 is known with a precision exceeding that of the scanning equipment being calibrated.

In a particular embodiment, the elements 16 include at least three (3) reference elements which are distinguishable from the other elements and from one another, and which are disposed such as to define a reference coordinate system of the phantom 10. In a particular embodiment, the reference elements have a larger diameter than that of the remaining elements 16 such as to be distinguishable therefrom, and are differently spaced with respect to one another such as to be distinguishable from one another. In other embodiments, the reference elements may be distinguishable by having smaller dimensions than the other elements, different dimensions from one another, different shapes with respect to the other elements and/or to one another, different wall thicknesses with respect to the other elements and/or to one another, a different contrast level with respect to the other elements and/or to one another, etc.

In the particular embodiment shown and with reference to FIGS. 3 and 4, the elements 16 include four (4) reference elements, in order to be able to locate the reference coordinate system even if one of the reference elements is missing from or incomplete in the scan. A reference element $16_O$ defines the origin of the reference coordinate system; a reference element $16_Y$ is located immediately adjacent the reference element $16_O$ in the direction of the Y-axis; a reference element $16_X$ is spaced apart from the reference element $16_O$ in the direction of the X-axis, with one of the other elements 16 being located therebetween; and a reference element $16_Z$ is spaced apart from the reference element $16_O$ in the direction of the Z-axis, with two of the other elements 16 being located therebetween. Different arrangements are also possible. For example, the reference elements could be located elsewhere than directly on the X, Y and Z axes, and the position of the axes may then be calculated from the relative position of the reference elements.

In a particular embodiment, the rows 18, 18' of elements 16 and the casing 12 are formed using a rapid prototyping method, for example selective laser sintering from powder or liquid polymer material. The elements 16 and casing 12 can be manufactured separately and then assembled, or alternately be manufactured in a single piece. Rapid prototyping methods allow for the elements 16 to be manufactured with small tolerances with respect to the original CAD drawing(s), such as to accurately know the dimensions of each element 16 and its relative position within the matrix 14. In a particular embodiment, the dimensions of each element 16 are known within a tolerance of 100 microns or lower, and its relative position within the matrix 14 is known with a tolerance of 50 microns or lower.

In use, and referring to FIG. 7, the body portion of the patient which needs to be scanned is placed in an appropriate type of coil, and the patient is scanned with the scanning system, which in a particular embodiment is a MRI, in order to obtain patient images, as set forth in step 106. Once the images are obtained, the patient is removed from the MRI, and the phantom 10 is placed in the coil. With the coil in the same position within the scanning machine as during the patient scan, the phantom 10 is scanned to obtain phantom images, as set forth in step 100. The phantom images are segmented, as shown in 102, and the distortion map is computed, as shown in 104.

In a particular embodiment, a typical processing of the patient images is performed as follows: the patient images are segmented to create contour(s) or point cloud(s) as per step 108, a mesh is then computed from the contour(s) or point cloud(s) as per step 110, and tridimensional surfaces are then created from the mesh, as per step 112. The patient images, contour(s), point cloud(s), mesh and tridimensional surfaces may be affected by the distortion of the scanning system. In a particular embodiment, the scan of the phantom 10 is used to calibrate the tridimensional patient data for increased precision. As illustrated in FIG. 7, a distortion map compensating for the distortion of the system can be applied directly to the patient images, to the contour(s)/point cloud(s), or to the mesh, so that calibrated tridimensional surfaces are obtained at step 112, as will be detailed further below.

FIGS. 8a-8b show the details of the segmentation of the phantom images of step 102, in accordance with a particular embodiment. For each image, a thresholding of the image is performed at 114, where the pixels of the images are separated into a first group above a given threshold and a second group below the given threshold, such as to create a black and white image. In this image, regions of different intensities each representing one of the elements are detected at 116, and the corresponding slice of each element, which is in a particular embodiment using spherical elements is disc-shaped, is detected in each region at 118. Then, a filtration of the center points is performed, to compensate for false detection due to noise. For every center point, an evaluation is performed to determine if the center point is located in a region corresponding to the intensity of an element, as shown at 120. If there is no correspondence, the center point is deleted, as shown at 122. If the center point corresponds to a region, the center point is kept. The next center point is evaluated until all the center points of the image have been filtered. The following image is then treated. When all the images have been treated, the segmentation is converted to the imaging reference system at 124, as determined with the help of the reference elements. Groups of center points are then formed from the neighborhood of each center point at 126.

A filtration of the groups is then performed, such as to eliminate the groups of center points which are not linked to the elements. For every group, the number of center points within the group is computed at 128. A constant N is fixed by the user to determine the threshold of noise. In a particular embodiment, N is 10; other values may also be used. If the number of center points is smaller than N, the group is kept. If not, the group is deleted at 130. The next group is then evaluated until all the groups have been filtered. The center of each group is then computed at 132, and a point cloud 134 corresponding to the real grid of points of the phantom is obtained.

Figure 9:
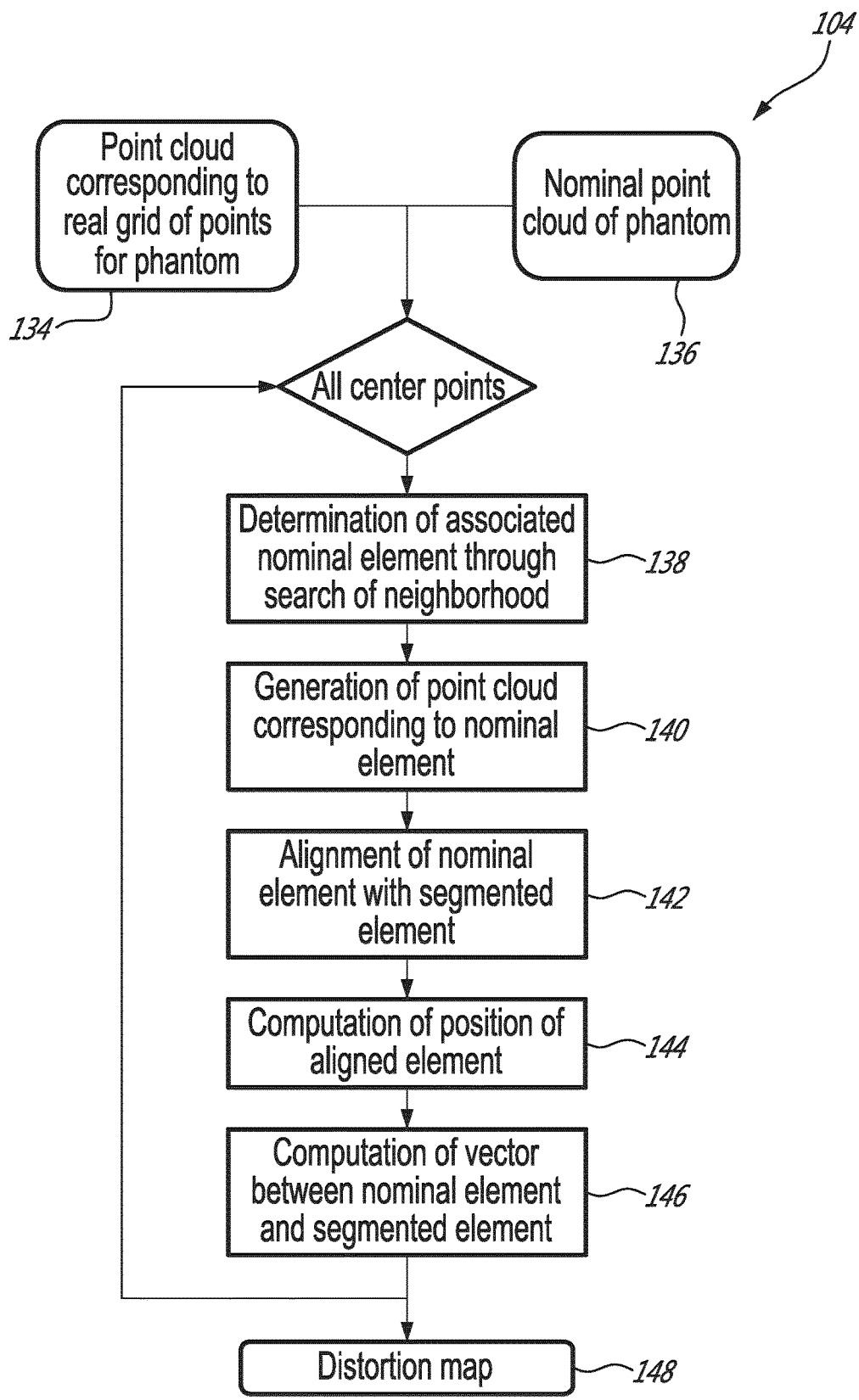
FIG. 9 is a diagram of a computation of the distortion map in the process of FIG. 7, in accordance with a particular embodiment.

FIG. 9 shows the details of the computation of the distortion map of step 104, in accordance with a particular embodiment. The distortion map is computed from the point cloud 134 corresponding to the grid of points of the scan of the phantom 10 and from the nominal point cloud 136 of the phantom (for example from a CAD model) including a known position for the center point of each element 16. For every center point, a determination of the associated nominal element from the nominal point cloud is performed through a search of its neighborhood, as shown at 138. A point cloud is generated at 140 in correspondence with the nominal element, and the nominal element is aligned with the segmented element from the real grid of points, at 142. In a particular embodiment, alignment of the nominal element with the segmented element is performed using an iterative closest point algorithm or ICP. The position of the aligned nominal element is computed at 144, and the vector between the nominal element and the segmented element is then computed at 146. When these operations have been performed for every center point, the distortion map 148 is defined.

As mentioned above and as shown in FIG. 7, the distortion map 148 can be applied to any tridimensional data obtained from the patient scan, including the patient images, the contour(s)/point cloud(s) generated through the segmentation thereof, and the mesh computed therefrom, in order to obtain calibrated tridimensional surfaces.

Figure 10:
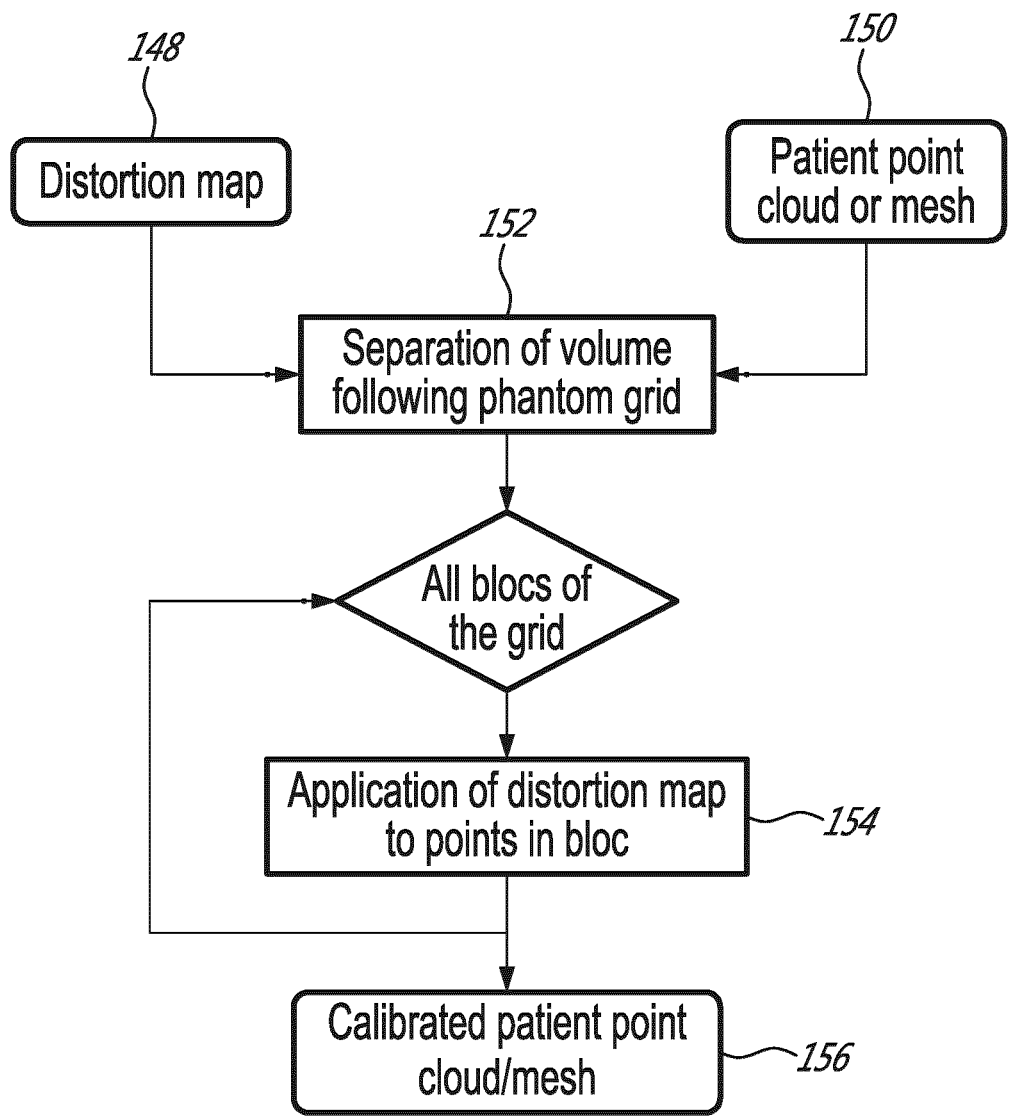
FIG. 10 is a diagram of the application of the distortion map to images in the process of FIG. 7, in accordance with a particular embodiment.

Referring to FIG. 10, the application of the distortion map 148 to a patient point cloud or mesh 150 (such as obtained after steps 108 or 110 of FIG. 7) is shown, in accordance with a particular embodiment. The volume of the point cloud or mesh is separated following the grid of the phantom, as shown at 152. Then, for all blocks of the grid, the distortion map is applied to the points in that block, as shown at 154. When this operation has been performed for every block of the grid, a calibrated point cloud or mesh 156 is obtained.

Figure 11:
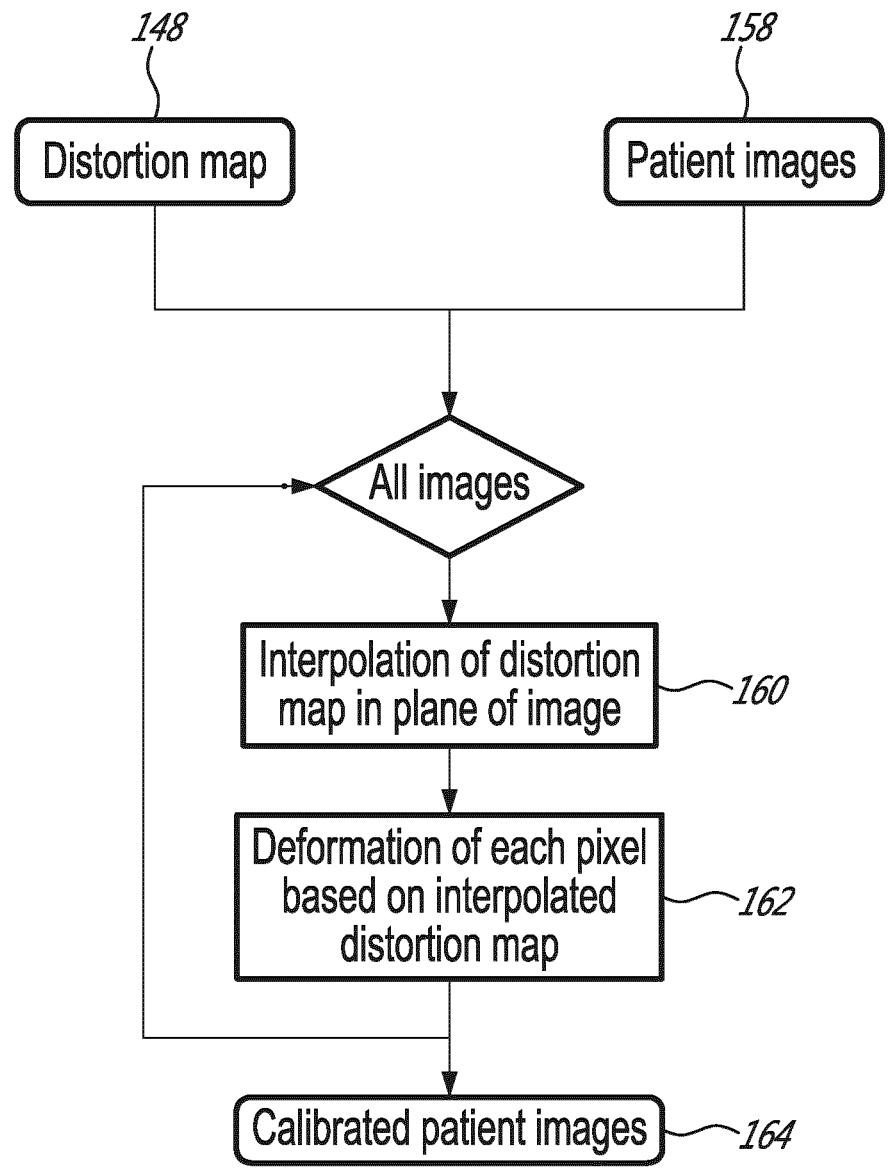
FIG. 11 is a diagram of the application of the distortion map to a point cloud or mesh in the process of FIG. 7, in accordance with a particular embodiment.

Referring to FIG. 11, the application of the distortion map 148 to the patient images 158 (such as obtained after step 106 of FIG. 7) is shown, in accordance with a particular embodiment. For each image, the distortion map is interpolated in the plane of the image, as shown at 160. Each pixel of the image is then deformed based on that interpolated distortion map, as per 162. When these operations have been performed for every patient image, calibrated patient images 164 are obtained.

Calibration of the distortion also allows for calibration of the 3D magnetic field of the scanning machine.

The phantom may 10 may be scanned before or after the body portion of the patient. Calibration with the phantom 10 may also be regularly performed independently of the number of patients being scanned between the calibration sessions.

The phantom images can also be used to calibrate the contrast of the scanning machine, either by comparison of the scan of elements 16 having different concentrations of contrasting agent, or by comparison of the scan of the elements 16 and the surrounding fluid which has a different contrast than the fluid contained in the elements 16. A calibration is performed to associate the elements 16 having different contrasts or the elements 16 and surrounding fluid with an expected intensity level of the scanned image.

The embodiments of the invention described above are intended to be exemplary. Those skilled in the art will therefore appreciate that the foregoing description is illustrative only, and that various alternate configurations and modifications can be devised without departing from the spirit of the present invention. Accordingly, the present invention is intended to embrace all such alternate configurations, modifications and variances which fall within the scope of the appended claims.

The invention claimed is:

1. A phantom for a medical imaging system using a coil, the phantom comprising:
a casing having at least one open end sealingly closed by a first removable cover and defining a sealed enclosure filled with a fluid, the casing being adapted to fit within an opening of the coil; and
a matrix of spherical hollow elements having a fixed position relative to one another and received within the enclosure, the matrix being defined by a plurality of interconnected rows of the elements, adjacent ones of the elements of a same one of the rows being interconnected by and in fluid communication through a hollow tube extending therebetween, each row defining at least one open end in fluid communication with the elements thereof, the at least one open end being sealingly closed by a second removable closing member, each element being filled with a solution having a different contrast than that of the fluid.

2. The phantom as defined in claim 1, wherein the elements include at least three reference elements distinguishable from one another and from the other hollow elements, the at least three reference elements establishing a reference coordinate system for the phantom.

3. The phantom as defined in claim 2, wherein the reference elements are distinguishable from the other hollow elements by having a different size.

4. The phantom as defined in claim 2, wherein the reference elements are distinguishable from one another by being differently spaced apart from one another.

5. The phantom as defined in claim 1, wherein the matrix of elements is retained in the enclosure by pins extending therefrom snugly and slidingly received within rails defined in a wall of the enclosure, with a spacer abutting the second removable cover member and the matrix of elements preventing movement along a direction of the rails.

6. The phantom as defined in claim 1, wherein the solution filling all the elements has the same contrast.

7. The phantom as defined in claims 1, wherein fluid communication between the rows of elements is prevented, and the solution filling the elements of one of the rows has a different contrast from the solution filling the elements of at least one other of the row.

8. The phantom as defined in claim 1, wherein the solution includes at least one element selected from the group consisting of copper pentasulfate, nickel chloride and sodium chloride.

9. A phantom for a medical imaging system, the phantom comprising:
a casing having at least one open end sealingly closed by a first removable closing member and defining a fluid-filled sealed enclosure, the casing having an outer shape adapted to be received in an opening of a coil of the imaging system; and
a plurality of groups of interconnected hollow elements received within the sealed enclosure, the elements of a same one of the groups being in fluid communication with one another, the elements of different ones of the groups being sealed from one another, each group including at least one open end in fluid communication with the elements of the group and sealingly closed by a second removable closing member, the groups being interconnected and retained within the sealed enclosure in a fixed position relative to one another, each element having a geometrical shape from which a center of the element can be determined, each element being filled with a fluid, the fluid filling the elements of at least one of the groups being more contrasting than the fluid filling the elements of at least another one of the groups.

10. The phantom as defined in claim 9, wherein each hollow element has a spherical shape.

11. The phantom as defined in claim 9, wherein the elements include at least three reference elements distinguishable from one another and from the other hollow elements, the at least three reference elements establishing a reference coordinate system for the phantom.

12. The phantom as defined in claim 11, wherein the reference elements are distinguishable from one another and from the other hollow elements by one or more of different dimensions, different shapes, different wall thicknesses, and different contrast levels.

13. The phantom as defined in claim 9, wherein the fluid filling the elements is a solution including at least one contrasting element selected from the group consisting of copper pentasulfate, nickel chloride and sodium chloride.

\* \* \* \* \*